United States Patent
Yu et al.

(10) Patent No.: US 9,741,443 B2
(45) Date of Patent: Aug. 22, 2017

(54) MEMORY CONTROLLER AND SYSTEM INCLUDING THE SAME

(71) Applicant: Samsung Electronics Co., Ltd., Suwon-si, Gyeonggi-do (KR)

(72) Inventors: Jae Sung Yu, Seoul (KR); Jung Pil Lee, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/675,847

(22) Filed: Apr. 1, 2015

(65) Prior Publication Data

US 2015/0287471 A1 Oct. 8, 2015

(30) Foreign Application Priority Data

Apr. 4, 2014 (KR) ........................ 10-2014-0040592

(51) Int. Cl.
| | |
|---|---|
| *G11C 16/32* | (2006.01) |
| *H03K 5/06* | (2006.01) |
| *H03K 5/05* | (2006.01) |
| *G06F 1/08* | (2006.01) |
| *G06F 1/12* | (2006.01) |
| *G06F 13/16* | (2006.01) |

(52) U.S. Cl.
CPC ............... *G11C 16/32* (2013.01); *G06F 1/08* (2013.01); *G06F 1/12* (2013.01); *G06F 13/1689* (2013.01); *H03K 5/05* (2013.01); *H03K 5/06* (2013.01)

(58) Field of Classification Search
CPC .. G11C 16/32; G06F 1/08; G06F 1/12; H03K 5/05; H03K 5/06
See application file for complete search history.

(56) References Cited

U.S. PATENT DOCUMENTS

| | | | |
|---|---|---|---|
| 6,003,118 A | 12/1999 | Chen | |
| 6,323,705 B1 | 11/2001 | Shieh et al. | |
| 6,584,021 B2 | 6/2003 | Heyne et al. | |
| 6,731,163 B2 | 5/2004 | Huckins et al. | |
| 6,895,522 B2 | 5/2005 | Johnson et al. | |
| 7,028,208 B2 | 4/2006 | Johnson et al. | |
| 7,999,589 B2 | 8/2011 | Lin | |
| 8,019,957 B1 | 9/2011 | White et al. | |
| 8,120,401 B2 * | 2/2012 | Kenly | H03K 7/08 327/172 |
| 8,421,512 B2 | 4/2013 | Murata et al. | |
| 8,976,596 B1 * | 3/2015 | Yamamoto | G11C 16/06 365/185.18 |
| 2001/0027503 A1 * | 10/2001 | Yamato | G06F 1/08 710/305 |

(Continued)

FOREIGN PATENT DOCUMENTS

| | | |
|---|---|---|
| KR | 20100031373 A | 3/2010 |
| KR | 20110138209 A | 12/2011 |

*Primary Examiner* — R Lance Reidlinger
(74) *Attorney, Agent, or Firm* — Harness, Dickey & Pierce, P.L.C.

(57) ABSTRACT

A memory controller according to an example embodiment of the present disclosure may include a duty ratio adjusting circuit which generates adjusted clock signals in response to a clock signal for strobing data, and a selection circuit which outputs one of the clock signal and the adjusted clock signals to a memory device as an output clock signal. Each of the adjusted clock signals may have a different duty ratio.

20 Claims, 11 Drawing Sheets

(56) References Cited

U.S. PATENT DOCUMENTS

| | | | | |
|---|---|---|---|---|
| 2011/0210773 A1* | 9/2011 | Chung | ............... | H03K 5/1565 |
| | | | | 327/158 |
| 2012/0250426 A1* | 10/2012 | Huang | ............... | G11C 7/1066 |
| | | | | 365/189.07 |
| 2012/0257466 A1* | 10/2012 | Kim | ............... | H03K 5/1565 |
| | | | | 365/193 |
| 2013/0073895 A1* | 3/2013 | Cohen | ............... | G06F 11/1068 |
| | | | | 714/6.2 |
| 2013/0250693 A1* | 9/2013 | Shimizu | ............... | G11C 16/32 |
| | | | | 365/185.18 |

* cited by examiner

"-" tracking : High duty compenstion

MEMORY CONTROLLER AND SYSTEM INCLUDING THE SAME

CROSS-REFERENCE TO RELATED APPLICATIONS

This application claims priority under 35 U.S.C. §119(a) from Korean Patent Application No. 10-2014-0040592 filed on Apr. 4, 2014, the disclosure of which is hereby incorporated by reference in its entirety.

BACKGROUND

Embodiments of the present disclosure relate to a memory controller, and more particularly to a memory controller which is capable of generating a duty ratio-adjusted clock signal for strobing data, and/or a system having the same.

For a stable input or output of data in a memory device, a duty ratio of a data strobe signal related to the input/output of the data should be maintained at a 50:50 ratio.

Even if the memory controller generates the data strobe signal having an exact duty ratio of 50:50 and transmits the generated data strobe signal to a memory device, the duty ratio of the data strobe signal fed back to the memory controller can be changed due to an RC delay on a signal line connected between the memory controller and the memory device, a change in a load capacitance of the memory device, or an internal logic (for example, a return clock signal generator) of the memory device.

When the memory controller reads data from the memory device using the data strobe signal, and the duty radio of the data strobe signal is changed, the memory controller cannot exactly process the data that is output from the memory device in some cases. Moreover, when the duty ratio of the data strobe signal is changed, speed for transmitting data to the memory controller may be changed.

SUMMARY

The present disclosure provides a memory controller which is capable of adjusting a duty ratio of a data strobe signal to be transmitted to the memory device according to the data strobe signal which is returned from the memory device. The memory controller can transmit the data strobe signal having an adjusted duty ratio to the memory device.

An example embodiment of the present disclosure is directed to a memory controller, including a duty ratio adjusting circuit which generates adjusted clock signals in response to a clock signal for strobing data, and a selection circuit which outputs one of the clock signal and the adjusted clock signals to a memory device as an output clock signal in response to selection signals. Each of the adjusted clock signals may have a different duty ratio.

According to an example embodiment, the memory controller may further include a memory which is programmable to store data for generating the selection signals. According to another example embodiment, the memory controller may further include a selection signal generator which generates the selection signals based on a difference between a phase of the clock signal and a phase of a feedback clock signal output from the memory device. According to another example embodiment, the memory controller may align a first edge of the clock signal and a first edge of a feedback clock signal with each other, and the memory controller may further include a selection signal generator which generates the selection signals based on a difference between a second edge of the clock signal and a second edge of the feedback clock signal.

The duty ratio adjusting circuit may include a first adjusting circuit which differently decreases an on-time of the clock signal so as to generate a first group of clock signals among the adjusted clock signals, and a second adjusting circuit which differently increases the on-time of the clock signal so as to generate a second group of clock signals among the adjusted clock signals.

The duty-ratio adjusting circuit may include a first inverter chain which receives the clock signal, a first AND gate which performs an AND operation on the clock signal and an output signal of the first inverter chain, a second inverter chain which receives the clock signal, and a first OR gate which performs an OR operation on the clock signal and an output signal of the second inverter chain.

The duty-ratio adjusting circuit may further include a third inverter chain which receives the clock signal, a second AND gate which performs the AND operation on the clock signal and an output signal of the third inverter chain, a fourth inverter chain which receives the clock signal, and a second OR gate which perform the OR operation on the clock signal and an output signal of the fourth inverter chain. The number of inverters included in the third inverter chain may be a multiple of the number of inverters included in the first inverter chain, and the number of inverters included in the fourth inverter chain may be a multiple of the number of inverters included in the second inverter chain.

An example embodiment of the present disclosure is directed to a memory system, including a memory controller which outputs an output clock signal, and a memory device which operates in response to the output clock signal. The memory controller may include a duty-ratio adjusting circuit which generates adjusted clock signals in response to a clock signal for strobing data, and a selection circuit which outputs one of the clock signal and the adjusted clock signals to the memory device as the output clock signal in response to selection signals. Each of the adjusted clock signals may have a different duty ratio.

An example embodiment of the present disclosure is directed to a data processing system including a memory device and a host which controls an operation of the memory device. The host may include a duty ratio adjusting circuit which generates adjusted clock signals in response to a clock signal for strobing data, and a selection circuit which outputs one of the clock signal and the adjusted clock signals to the memory device as an output clock signal. Each of the adjusted clock signals may have a different duty ratio.

BRIEF DESCRIPTION OF THE DRAWINGS

These and/or other aspects and advantages of the present disclosure will become apparent and more readily appreciated from the following description of the embodiments, taken in conjunction with the accompanying drawings of which.

DETAILED DESCRIPTIONS

Figure 1:
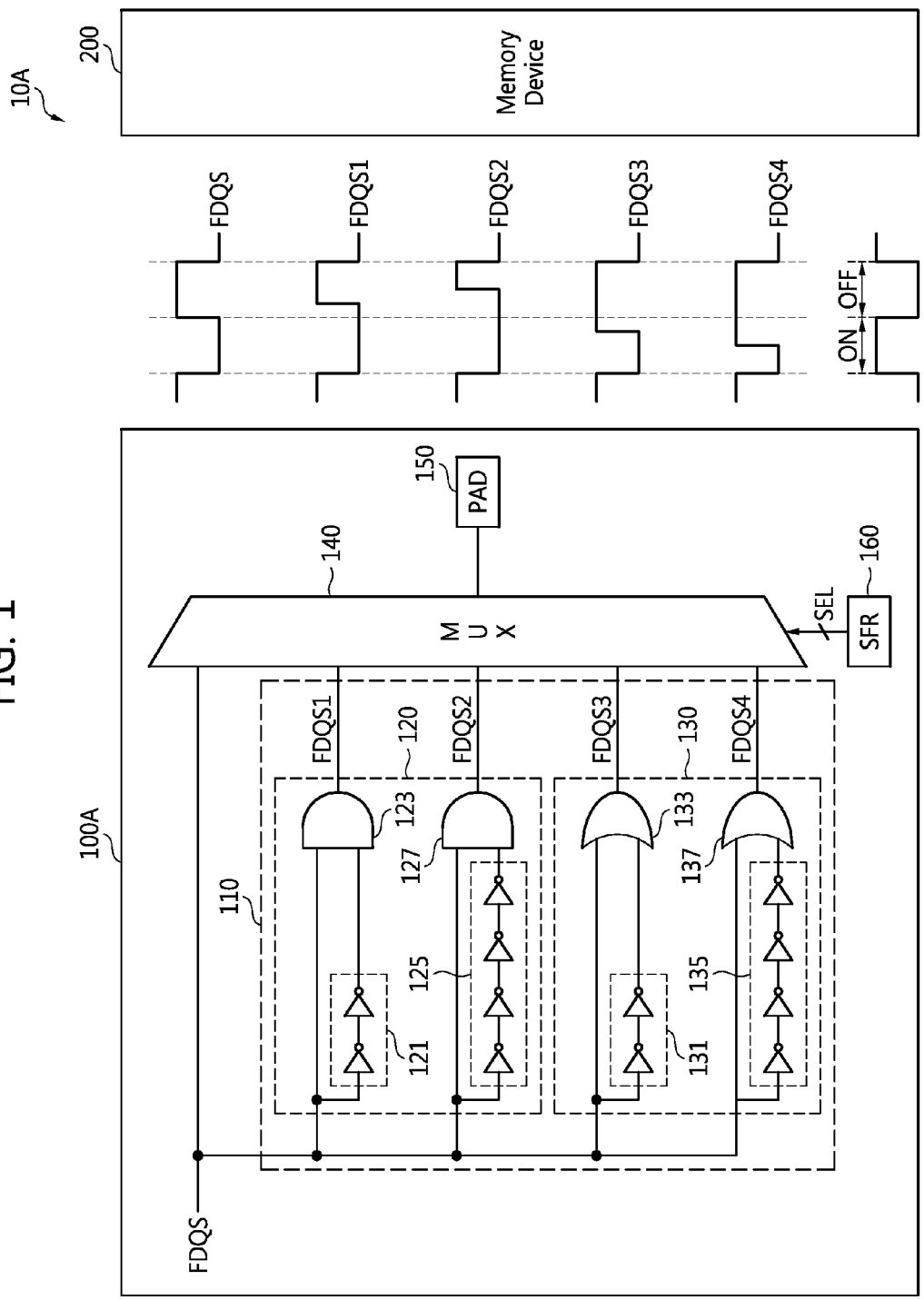
FIG. 1 is a block diagram of a data processing system according to an example embodiment of the present disclosure.

The present disclosure now will be described more fully hereinafter with reference to the accompanying drawings, in which embodiments of the present disclosure are shown. The present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a data processing system according to an example embodiment of the present disclosure. Referring to FIG. 1, a data processing system 10A which may be referred to as a memory system may include a memory controller 100A and a memory device 200.

The data processing system 10A may be embodied as a personal computer (PC), or a portable electronic device. The portable electronic device may be embodied as a laptop computer, a cellular (or a mobile) phone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable device, an internet of things (IoT) device, an internet of everything (IoE) device, or an e-book.

The data processing system 10A may mean a system which may use a clock signal for strobing data, for example, a data strobe signal. For example, the data processing system 10A may be embodied as a solid state drive (SSD) or an embedded SSD (eSSD).

A memory controller 100A may function as a host. The host may be embodied as an integrated circuit (IC), a system on chip (SoC), an application processor (AP), or a mobile AP.

The memory controller 100A may include a duty ratio adjusting circuit 110, a selection circuit 140, an output pad 150, or a programmable memory 160.

The duty ratio adjusting circuit 110 may generate adjusted clock signals FDQS1 to FDQS4 in response to a clock signal FDQS for strobing data. Each of the adjusted clock signals FDQS1 to FDQS4 may have a different duty ratio. The duty ratio adjusting circuit 110 may include a first adjusting circuit 120 and a second adjusting circuit 130.

The first adjusting circuit 120 may differently decrease on-time ON of the clock signal FDQS so as to generate a first group of clock signals FDQS1 and FDQS2 included in the adjusted clock signals FDQS1 to FDQS4. The second adjusting circuit 130 may differently increase the on-time ON of the clock signal FDQS so as to generate a second group of clock signals FDQS3 and FDQS4 included in the adjusted clock signals FDQS1 to FDQS4.

As shown in FIG. 1, on-time ON means a time for maintaining a high level of a clock signal, and off-time OFF means time for maintaining a low level of the clock signal. Therefore, a duty ratio may be determined by the on-time ON.

The first adjusting circuit 120 may include a first inverter chain 121, a first AND gate 123, a third inverter chain 125, and a second AND gate 127.

The first inverter chain 121 may receive the clock signal FDQS. The first AND gate 123 may perform an AND operation on the clock signal FDQS and an output signal of the first inverter chain 121, and may output a first clock signal FDQS1 of which duty ratio is adjusted. On-time of the first clock signal FDQS1 may be adjusted to be shorter than the on-time of the clock signal FDQS. The third inverter chain 125 may receive the clock signal FDQS. The second AND gate 127 may perform an AND operation on the clock signal FDQS and an output signal of the second inverter chain 125, and may output a second clock signal FDQS2 of which duty ratio is adjusted. On-time of the second clock signal FDQS2 may be adjusted to be shorter than the on-time of the first clock signal FDQS1.

The number of inverters included in the third inverter chain 125 may be a multiple of the number of inverters included in the first inverter chain 121.

The second adjusting circuit 130 may include a second inverter chain 131, a first OR gate 133, a fourth inverter chain 135, and a second OR gate 137.

The second inverter chain 131 may receive the clock signal FDQS. The first OR gate 133 may perform an OR operation on the clock signal FDQS and an output signal of the second inverter chain 131, and may output a third clock signal FDQS3 of which duty ratio is adjusted. On-time of the third clock signal FDQS3 may be adjusted to be longer than the on-time of the clock signal FDQS1. The fourth inverter chain 135 may receive the clock signal FDQS.

The second OR gate 137 may perform the OR operation on the clock signal FDQS and an output signal of the fourth inverter chain 135, and may output a fourth clock signal FDQS4 of which duty ratio is adjusted. On-time of the fourth clock signal FDQS4 may be adjusted to be longer than the on-time of the third clock signal FDQS3. The number of inverters included in the fourth inverter chain 135 may be a multiple of the number of inverters included in the second inverter chain 131.

The selection circuit 140 may output one of the clock signal FDQS, the first clock signal FDQS1, the second clock signal FDQS2, the third clock signal FDQS3, and the fourth clock signal FDQS4 to an output pad 150 as an output clock signal in response to selection signals SEL. An output clock signal that is output through the output pad 150 may be transmitted to the memory device 200 through an interface, e.g., wiring. For example, the output pad 150 may mean a pin.

The selection signals SEL may be generated based on signals or data to be programmed in the programmable memory 160. For example, the programmable memory 160 may be embodied as a special function register (SFR). For example, data stored in the SFR 160 may be stored through a test device. For example, the test device may measure a duty ratio related to a return clock signal which is returned from the memory device 200 to the memory controller 100A or a clock signal to be fed back (that is, a clock signal related to the clock signal FDQS), and the test device may set or program data in the SFR 160 according to a result of the measurement.

The memory device 200 may be a flash-based memory device.

The flash-based memory device may include a plurality of memory cells, and each of the plurality of memory cells may be embodied as a single level cell (SLC) which stores one-bit data or a multi level cell (MLC) which stores two bit or more data. For example, the memory device 200 may be embodied as a smart card, a secure digital (SD) card, a micro SD card, a multimedia card (MMC), an embedded MMC (eMMC), an embedded multi-chip package (eMCP), a Perfect Page NAND (PPN), or a universal flash storage (UFS).

Figure 2:
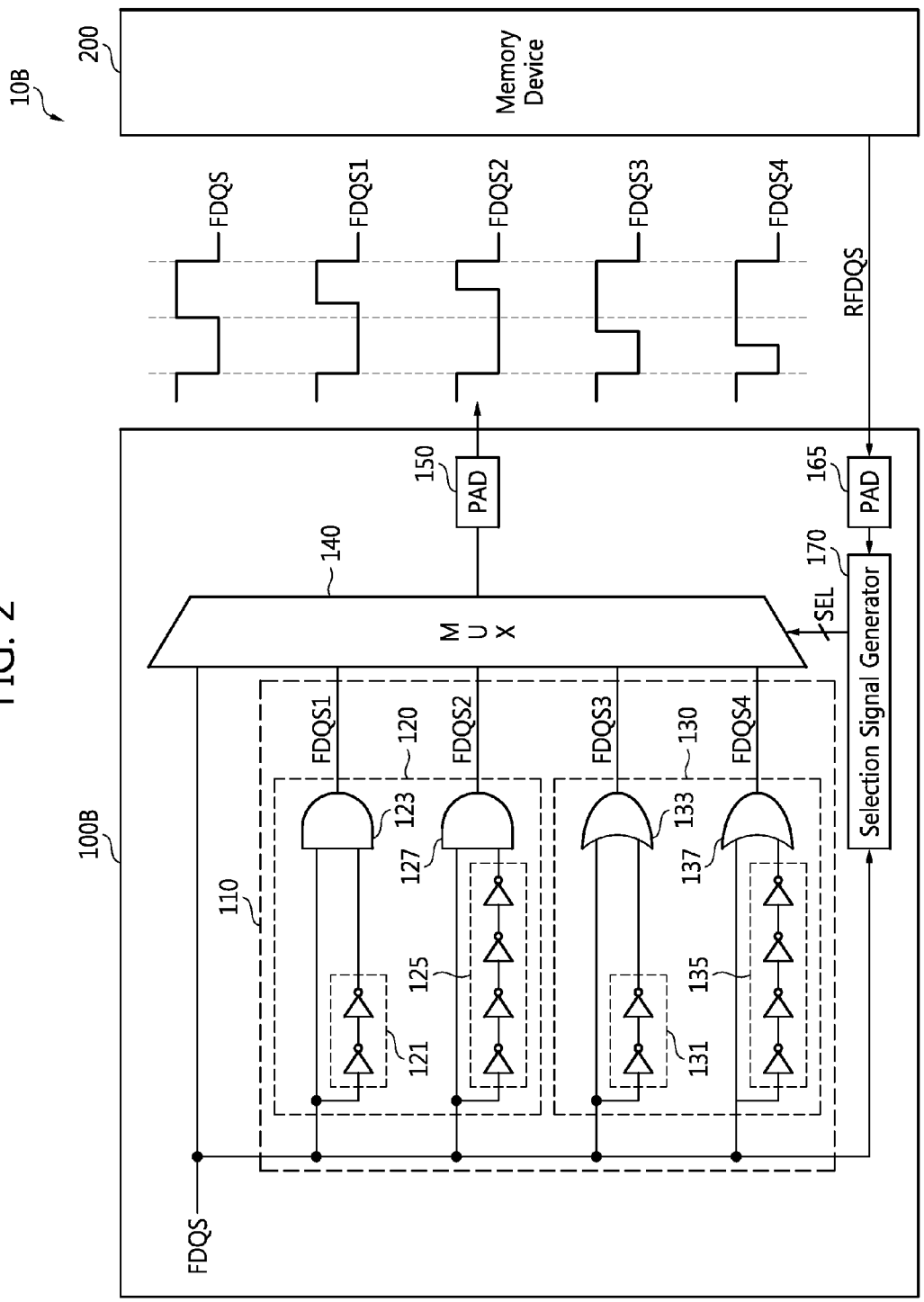
FIG. 2 is a block diagram of a data processing system according to another example embodiment of the present disclosure.

FIG. 2 is a block diagram of a data processing system according to another example embodiment of the present disclosure. Referring to FIGS. 1 and 2, a data processing system 10B may include a memory controller 100B and a memory device 200.

The memory controller 100B may function as a host. The memory controller 100B may include a duty ratio adjusting circuit 110, a selection circuit 140, an output pad 150, an input pad 165, and a selection signal generator 170.

Except for the input pad 165 and the selection signal generator 170, a structure and an operation of the memory controller 100B of FIG. 2 are substantially the same as a structure and an operation of the memory controller 100A of FIG. 1. The input pad 165 may receive a return clock signal RFDQS or a feedback clock signal RFDQS that is output from the memory device 200, and may output the return clock signal RFDQS or the feedback clock signal RFDQS to the selection signal generator 170.

The selection signal generator 170 may generate selection signals SEL based on the clock signal FDQS for strobing data and the feedback clock signal RFDQS that is output from the memory device 200. The feedback clock signal RFDQS which may be referred to as the return clock signal is a signal related to the clock signal FDQS for strobing the data. The selection signal generator 170 may compare a duty ratio of the clock signal FDQS with a duty ratio of the feedback clock signal RFDQS, and may generate selection signals SEL according to a result of the comparison.

Figure 3A:
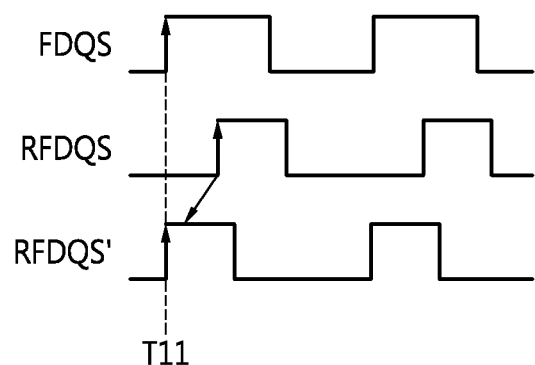
FIGS. 3A and 3B are conceptual diagrams describing an example embodiment of operations of a selection signal generator illustrated in FIG. 2.
Figure 3B:
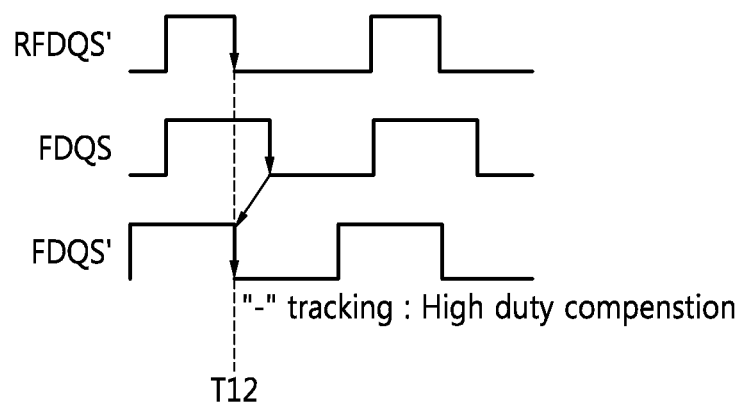

FIGS. 3A and 3B are conceptual diagrams describing an example embodiment of operations of a selection signal generator illustrated in FIG. 2. An operation of the selection signal generator 170 is described referring to FIGS. 2, 3A, and 3B.

As shown in FIG. 3A, at a first time (or time point) T11, since a phase of a rising edge of the clock signal FDQS does not accord with a phase of a rising edge of the feedback clock signal RFDQS, the selection signal generator 170 may cause the phase of the rising edge of the clock signal FDQS and the phase of the rising edge of the feedback clock signal RFDQS to be accorded or aligned with each other. At the first time T11, the selection signal generator 170 may perform phase locking or pre-locking. Here, RFDQS' means a phase-locked feedback clock signal.

As shown in FIG. 3B, at a second time T12, a phase of a falling edge of the phase-locked feedback clock signal RFDQS' does not accord with a phase of a falling edge of the clock signal FDQS. That is, the phase of the falling edge of the phase-locked feedback signal RFDQS' may lead ahead the phase of the falling edge of the clock signal FDQS. Thus, at the second time T12, the phase of the falling edge of the clock signal FDQS may be moved to a left side so as to accord with the phase of the falling edge of the phase-locked feedback clock signal RFDQS'.

This is referred to as a negative tracking or high duty compensation. On-time of an output clock signal may be increased to perform the negative tracking or the high duty compensation.

The selection signal generator 170 may generate selection signals SEL for the negative tracking. The selection circuit 140 may output the third clock signal FDQS3 or the fourth clock signal FDQS4 as an output clock signal in response to the selection signals SEL for the negative tracking.

As a difference between the phase of the falling edge of the clock signal FDQS and the phase of the falling edge of the phase-locked feedback clock signal RFDQS' increases, the on-time of the output clock signal may increase. At a next time, the phase of the falling edge of the clock signal FDQS and the phase of the falling edge of the phase locked feedback clock signal RFDQS' which is related to one of the third clock signal FDQS3 and the fourth clock signal FDQS4 may be accorded with each other.

Figure 4A:
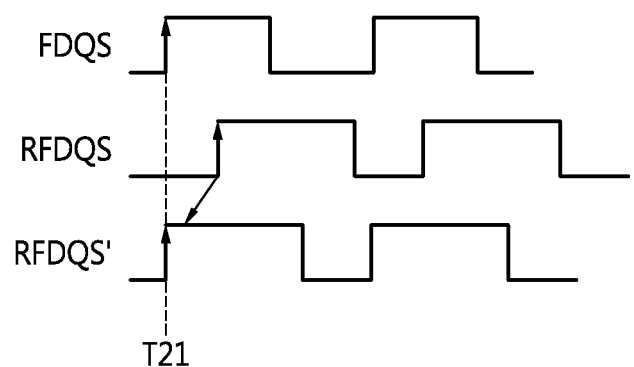
FIGS. 4A and 4B are conceptual diagrams describing another example embodiment of the operations of the selection signal generator illustrated in FIG. 2.
Figure 4B:
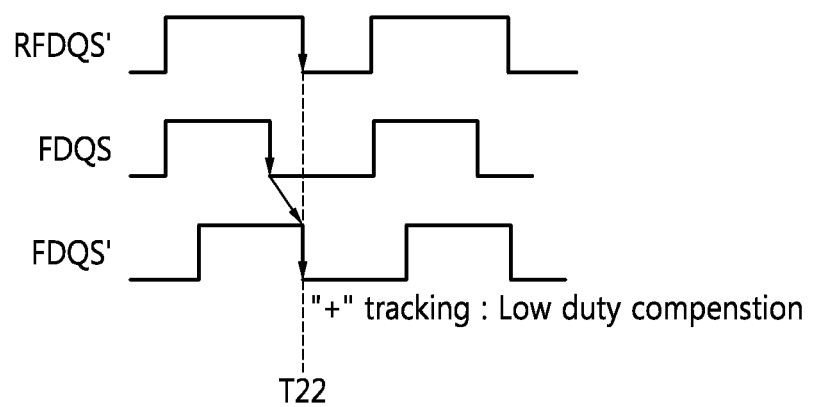

FIGS. 4A and 4B are conceptual diagrams describing another example embodiment of operations of the selection signal generator illustrated in FIG. 2. The operations of the selection signal generator 170 will be described referring to FIGS. 2, 4A, and 4B.

As shown in FIG. 4A, at a third time T21, since a phase of a rising edge of the clock signal FDQS does not accord with a phase of a rising edge of the feedback clock signal RFDQS, the selection signal generator 170 may cause the phase of the rising edge of the clock signal FDQS and the phase of the rising edge of the feedback clock signal RFDQS to be accorded or aligned with each other. At the third time T21, the selection signal generator 170 can perform a phase locking or a free-locking. Here, RFDQS' means a phase locked feedback clock signal.

As shown in FIG. 4B, at a fourth time T22, a phase of a falling edge of the phase locked feedback clock signal RFDQS' does not accord with a phase of a falling edge of the clock signal FDQS. That is, the phase of the falling edge of the phase locked feedback clock signal RFDQS' may lag behind the phase of the falling edge of the clock signal FDQS.

At the fourth time T22, the phase of the falling edge of the clock signal FDQS may be moved to a right side so as to cause the phase of the falling edge of the clock signal FDQS and the phase of the falling edge of the phase-locked feedback clock signal RFDQS' to be accorded with each other.

This is referred to as a positive tracking or low duty compensation. In order to perform the positive tracking or the low duty compensation, on-time of an output clock signal may be decreased. That is, off-time of the output clock signal may be increased.

The selection signal generator 170 may generate selection signals SEL for the positive tracking. Accordingly, the selection circuit 140 may output the first clock signal FDQS1 or the second clock signal FDQS2 as an output clock signal in response to the selection signals SEL for the positive tracking.

At a next time, the phase of the falling edge of the locked feedback clock signal RFDQS' related to one of the first clock signal FDQS1 and the second clock signal FDQS2 may accord with the phase of the falling edge of the clock signal FDQS. For example, the memory device 200 may output the feedback clock signal RFDQS having an exact duty ratio of 50:50 to the memory controller 100B through processes described referring to FIGS. 3A to 4B.

Figure 5:
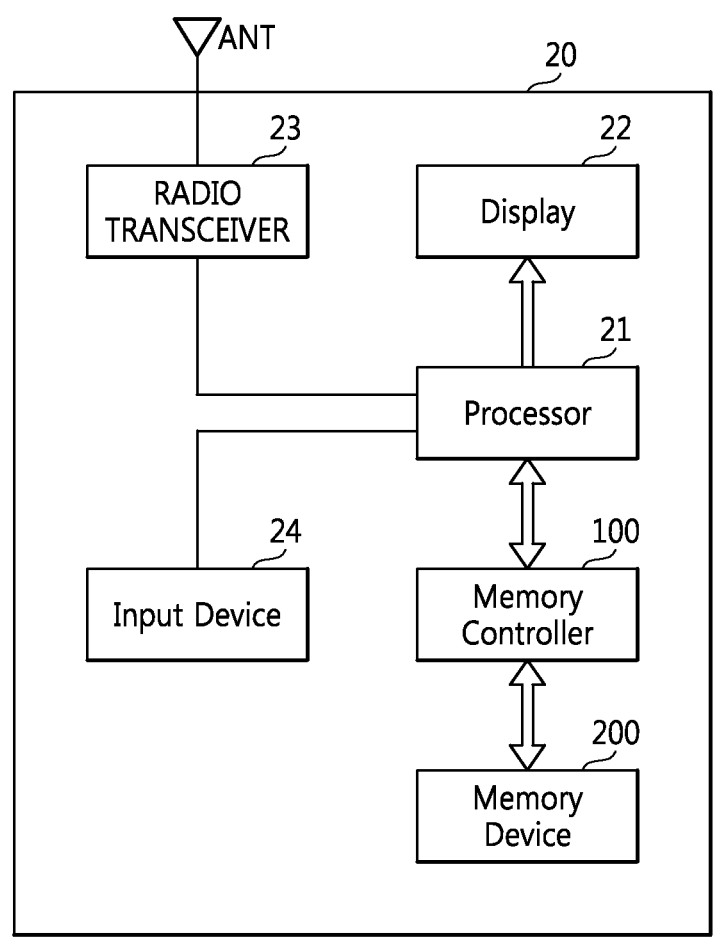
FIG. 5 is a block diagram which shows an example embodiment of the data processing system including a memory controller shown in FIG. 1 or 2.

FIG. 5 is a block diagram which shows an example embodiment of the data processing system including a memory controller shown in FIG. 1 or 2. Referring to FIGS. 1 to 5, a data processing system 20 may be embodied as a cellular phone, a smart phone, a tablet PC, a personal digital assistant (PDA), a IoT device, an IoE device, or a wireless communication device.

The data processing system 20 may include a memory controller 100A or 100B (hereinafter, collectively "100") and a memory device 200. The memory controller 100 may control a data access operation, e.g., a program operation, an erase operation, or a read operation, in the memory device 200 according to a control of the processor 21.

The wireless transceiver 23 may transmit or receive a radio signal through an antenna ANT. For example, the wireless transceiver 23 may change a radio signal received through the antenna ANT into a signal to be processed by the processor 21. The processor 21 may change a signal that is output from the wireless transceiver 23 into a radio signal, and may output a changed radio signal to an external device through the antenna ANT.

An input device 24 may be embodied as a pointing device, such as a touch pad and a computer mouse, a keyboard, or a keypad, which may input a control signal for controlling an operation of the processor 21 or data to be processed by the processor 21. The processor 21 may control an operation of a display 22 so that data that is output from the memory controller 100, data that is output from the radio transceiver 23, or data that is output from the input device 24 may be displayed through the display 22.

According to an example embodiment, the memory controller 100 which may control an operation of the memory device 200 may be embodied as a portion of the processor 21 or a separated chip from the processor 21.

Figure 6:
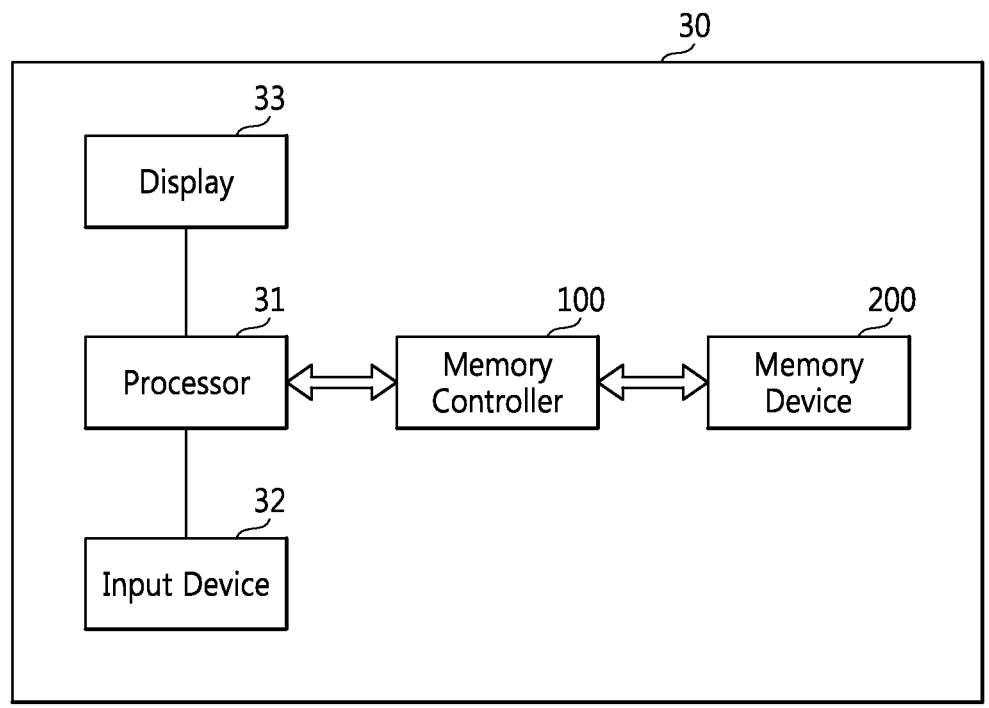
FIG. 6 is another example embodiment of the data processing system including the memory controller shown in FIG. 1 or 2.

FIG. 6 is another example embodiment of the data processing system including the memory controller shown in FIG. 1 or 2. A data processing system 30 shown in FIG. 6 may be embodied as a PC, a tablet PC, a net-book, an e-reader, a PAD, a PMP, an MP3 player, or an MP4 player.

The data processing system 30 may include the memory controller 100 and the memory device 200. The processor 31 may display data stored in the memory device 200 through the display 33 according to data that is input through the input device 32. For example, the input device 32 may be embodied as a pointing device such as a touch pad or a computer mouse, a keypad, or a keyboard.

The processor 31 may control an entire operation of the data processing system 30, and may control an operation of the memory controller 100. According to an example embodiment, the memory controller 100 which controls an operation of the memory device 200 may be embodied as a portion of the processor 31 or a separated chip from the processor 31.

Figure 7:
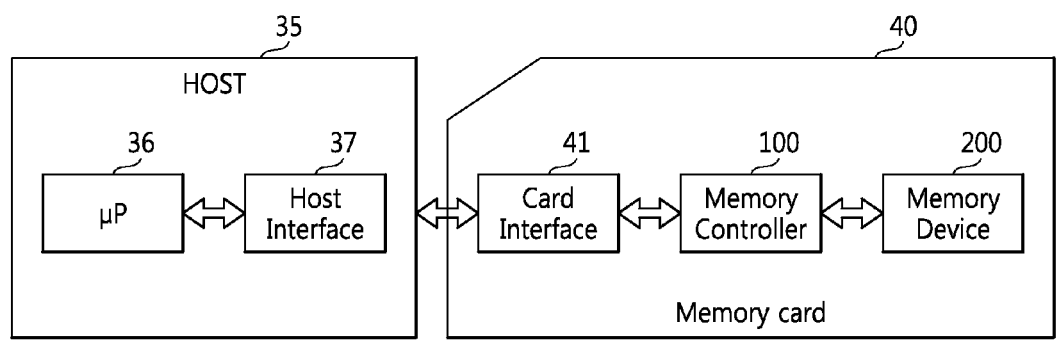
FIG. 7 is still another example embodiment of the data processing system including the memory controller shown in FIG. 1 or 2.

FIG. 7 is still another example embodiment of the data processing system including the memory controller shown in FIG. 1 or 2. The data processing system 40 may be embodied as a memory card or a smart card. The data processing system 40 may include a card interface 41, the memory controller 100, and the memory device 200. The memory controller 100 may control data exchange between the card interface 41 and the memory device 200.

According to an example embodiment, the card interface 41 may be a secure digital (SD) card interface or a multi-media card (MMC) interface. However, the card interface is not limited thereto. The card interface 41 may interface the data exchange between a host 35 and the memory controller 100 according to a protocol of the host 35.

According to an example embodiment, the card interface 41 may support a universal serial bus (USB) protocol and an interchip (IC)-USB protocol. Here, the card interface may mean hardware which may support a protocol used by the host 35, software installed in the hardware, or a signal transmission method.

When the data processing system 40 is connected to a host interface 37 of the host 35 such as a PC, a tablet PC, a digital camera, a digital audio player, a cellular phone, console video game hardware, or a digital set-top box, the host interface 37 may perform data communication with the memory device 200 through the card interface 41 and the memory controller 100 according to a control of a microprocessor 36.

Figure 8:
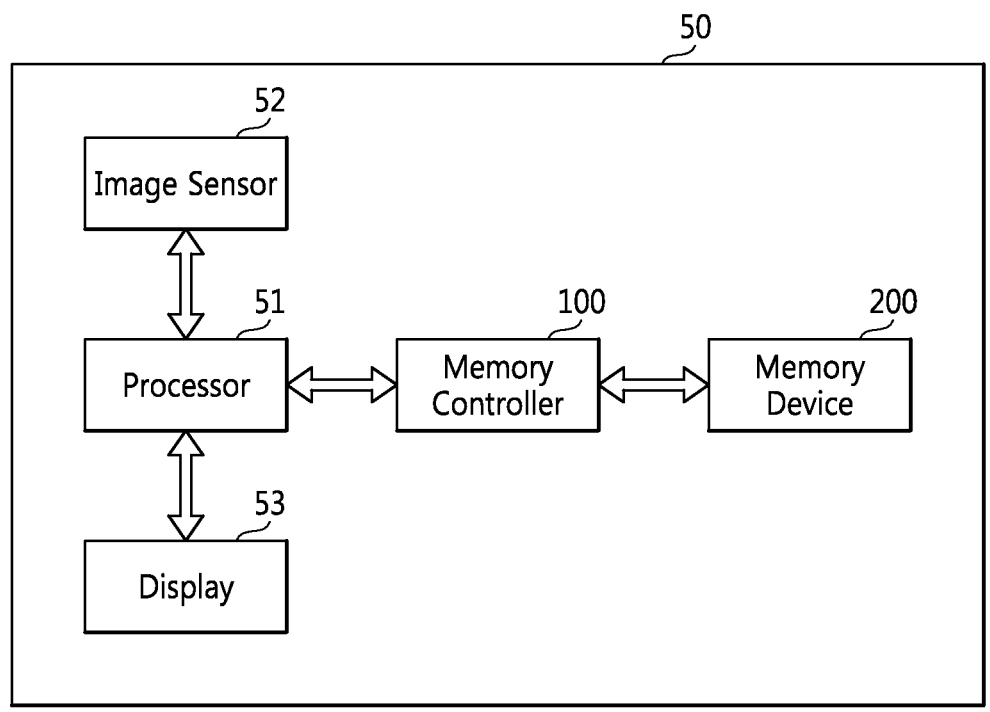
FIG. 8 is still another example embodiment of the data processing system including the memory controller shown in FIG. 1 or 2.

FIG. 8 is still another example embodiment of the data processing system including the memory controller shown in FIG. 1 or 2. A data processing system 50 shown in FIG. 8 may be embodied as an image processing device, e.g., a digital camera, a digital camera embedded cellular phone, a digital camera embedded smart phone, or a digital camera embedded tablet PC.

The data processing system 50 may include the memory device 200, and the memory controller 100 which may control a data processing operation, e.g., a program operation, an erase operation, or a read operation, of the memory device 200.

An image sensor 52 of the data processing system 50 may convert an optical image into digital signals, and may transmit the converted digital signals to a processor 51 or the memory controller 100. According to a control of the processor 51, the converted digital signals may be displayed through the display 53 or may be stored in the memory device 200 through the memory controller 100. In addition, data stored in the memory device 200 are displayed through the display 53 according to the control of the processor 51 or the memory controller 100.

According to an example embodiment, the memory controller 100 which controls an operation of the memory device 200 may be embodied as a portion of the processor 51 or a separated chip from the processor 51.

Figure 9:
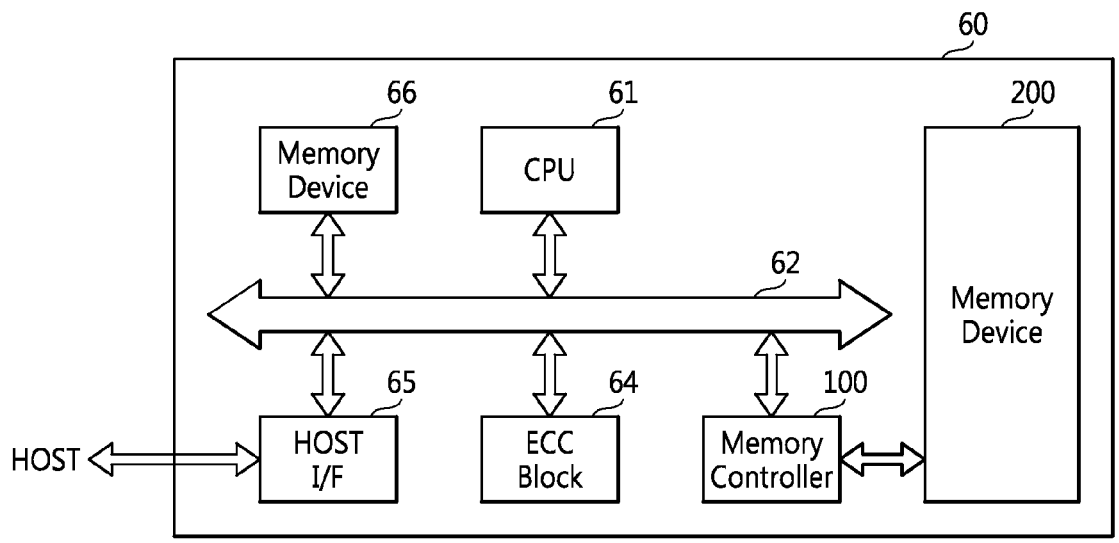
FIG. 9 is still another example embodiment of the data processing system including the memory controller shown in FIG. 1 or 2.

FIG. 9 is still another example embodiment of the data processing system including the memory controller shown in FIG. 1 or 2. Referring to FIG. 9, the data processing system 60 may include the memory controller 100, the memory device 200, and a central processing unit (CPU) 61 which controls an operation of the memory controller 100.

The data processing system 60 may include a memory device 66 which may be used as an operation memory of the CPU 61. The memory device 66 may be embodied as a non-volatile memory such as a read only memory (ROM), and a volatile memory such as a static random access memory (SRAM). A host connected to the data processing system 60 may perform data communication with the memory device 200 through a host interface 65.

According to a control of the CPU 61, an error correction code (ECC) block 64 may detect an error bit included in data that is output from the memory device 200, correct the error bit, and transmit the error-corrected data to a host through the host interface 65. The CPU 61 may control data communication among the ECC block 64, the host interface 65, and the memory device 200 through a bus 62.

The data processing system 60 may be embodied as a flash memory drive, a USB memory drive, an IC-USB memory drive, or a memory stick.

Figure 10:
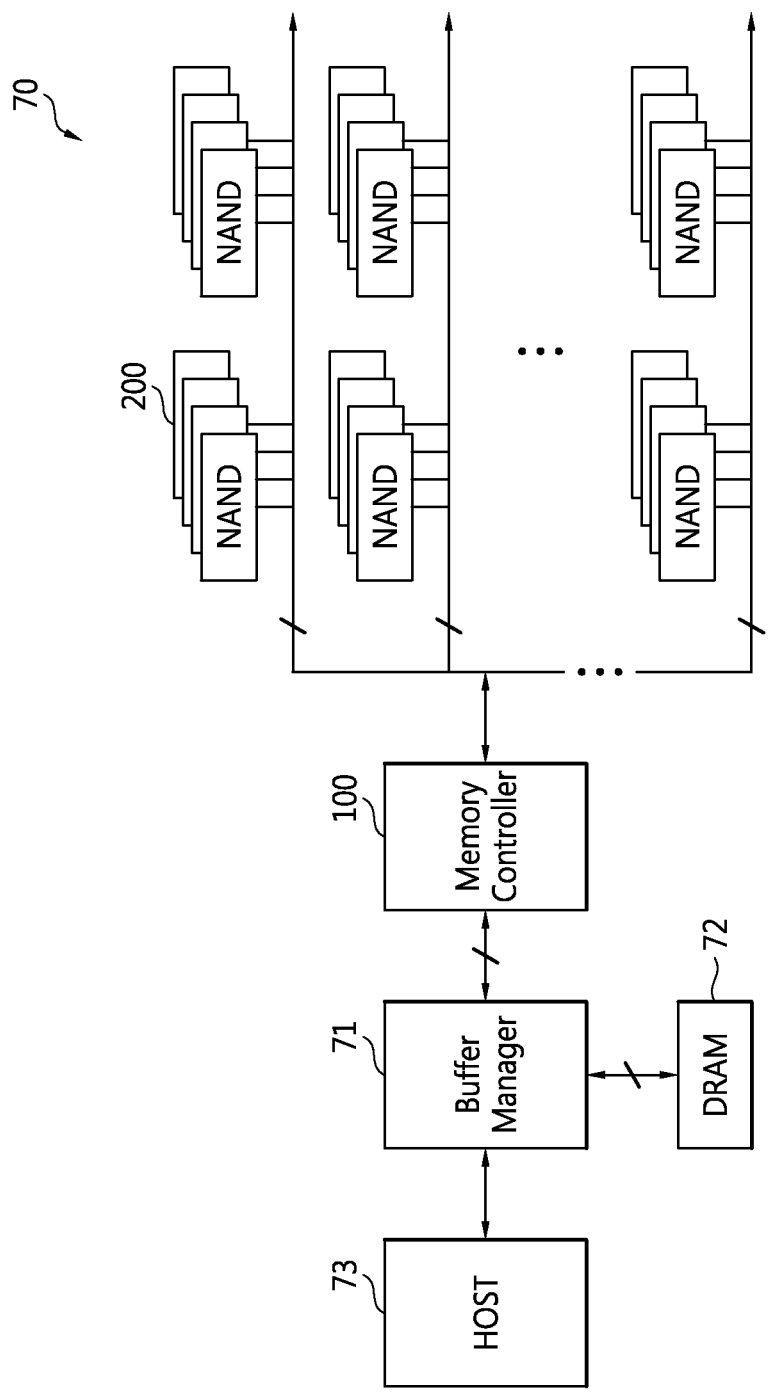
FIG. 10 is still another example embodiment of the data processing system including the memory controller shown in FIG. 1 or 2.

FIG. 10 is still another example embodiment of the data processing system including the memory controller shown in FIG. 1 or 2. Referring to FIG. 10, a data processing system 70 may be embodied as a data processing device such as a solid state drive (SSD).

The data processing system 70 may include a plurality of memory devices 200, a memory controller 100 which controls a data processing operation of each of the plurality of memory devices 200, a volatile memory device 72 such as a DRAM, and a buffer manager 71 which controls storage of data transmitted or received between the memory controller 10 and the host 73 in the volatile memory device 72. The host 73 may transmit or receive data to or from the buffer manager 71.

Figure 11:
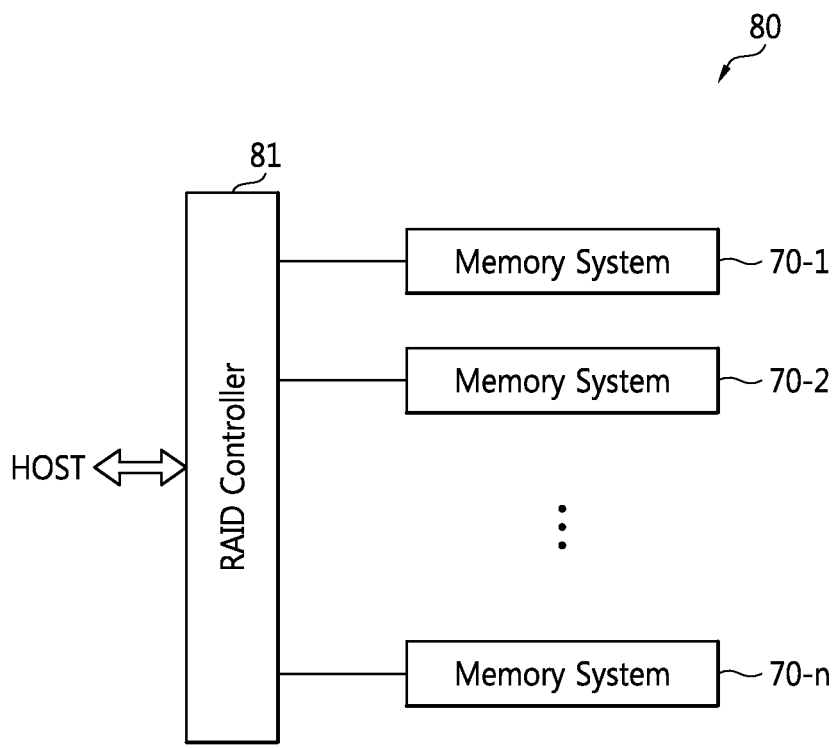
FIG. 11 is an example embodiment of a redundant array of independent disks (RAID) system which includes the data processing system of FIG. 10.

FIG. 11 is an example embodiment of a redundant array of independent disks (RAID) system which includes the data processing system of FIG. 10. Referring to FIG. 11, a data processing system 80 may be embodied as the RAID system. The data processing system 80 may include a RAID controller 81 and a plurality of data processing systems 70-1 to 70-n, where n is a natural number. Each of the plurality of data processing systems 70-1 to 70-n may be the data processing system 70 shown in FIG. 10. The plurality of data processing systems 70-1 to 70-n may configure a RAID array. The data processing device 80 may be embodied as a personal computer (PC) or a SSD.

During a program operation, the RAID controller 81 may output, based on a RAID level, to at least one of the plurality of data processing systems 70-1 to 70-n program data that is output from a host according to a program command that is output from the host. During a read operation, the RAID controller 81 may transmit to the host data that is read from at least one of the plurality of data processing systems 70-1 to 70-n according to a read command that is output from a host.

A memory controller according to an example embodiment of the present disclosure may adjust a duty-ratio of a data strobe signal to be transmitted to the memory device according to the data strobe signal returned from a memory device, and may transmit the data strobe signal having an adjusted duty ratio to the memory device.

A memory controller according to an example embodiment of the present disclosure may detect a duty distortion of a data strobe signal returned or fed back from a memory device, adjust a duty ratio of the data strobe signal to be transmitted to the memory device according to a result of the detection, and transmit the data strobe signal having an adjusted duty ratio to the memory device. For example, a duty ratio of the adjusted data strobe signal does not need to be an exact duty ratio of 50:50.

Although a few embodiments of the present disclosure have been shown and described, it will be appreciated by those skilled in the art that changes may be made in these embodiments without departing from the principles and spirit of the present disclosure, the scope of which is defined in the appended claims and their equivalents.

What is claimed is:

1. A memory controller comprising:
a duty ratio adjusting circuit configured to generate a plurality of adjusted clock signals in response to a clock signal for strobing data, each of the plurality of adjusted clock signals having a different duty ratio; and
a selection circuit configured to receive the clock signal and the plurality of adjusted clock signals and to output one signal among the clock signal and the plurality of adjusted clock signals to a memory device as an output clock signal in response to selection signals;
a selection signal generator configured to generate the selection signals based on the clock signal and a feedback clock signal that is output from the memory device.

2. The memory controller of claim 1, further comprising a programmable memory configured to store data for generating the selection signals.

3. The memory controller of claim 1, wherein the selection signal generator is configured to generate the selection signals based on a phase of the clock signal and a phase of the feedback clock signal that is output from the memory device.

4. The memory controller of claim 1, wherein the selection signal generator is configured to align a first edge of the clock signal and a first edge of the feedback clock signal that is output from the memory device with each other, and then generate the selection signals based on a difference of a second edge of the clock signal and a second edge of the feedback clock signal.

5. The memory controller of claim 1, wherein the duty ratio adjusting circuit includes:

a first adjusting circuit configured to differently decrease an on-time of the clock signal so as to generate a first group of clock signals among the plurality of adjusted clock signals; and a second adjusting circuit configured to differently increase the on-time of the clock signal so as to generate a second group of clock signals among the plurality of adjusted clock signals.

6. The memory controller of claim 1, wherein the duty ratio adjusting circuit includes:
   a first inverter chain configured to receive the clock signal;
   a first AND gate configured to perform an AND operation on the clock signal and an output signal of the first inverter chain;
   a second inverter chain configured to receive the clock signal; and
   a first OR gate configured to perform an OR operation on the clock signal and an output signal of the second inverter chain.

7. The memory controller of claim 6, wherein the duty ratio adjusting circuit includes:
   a third inverter chain configured to receive the clock signal;
   a second AND gate configured to perform an AND operation on the clock signal and an output signal of the third inverter chain;
   a fourth inverter chain configured to receive the clock signal; and
   a second OR gate configured to perform an OR operation on the clock signal and an output signal of the fourth inverter chain.

8. The memory controller of claim 7, wherein a number of inverters included in the third inverter chain is a multiple of a number of inverters included in the first inverter chain, and a number of inverters included in the fourth inverter chain is a multiple of a number of inverters included in the second inverter chain.

9. A memory system comprising:
   a memory controller configured to output an output clock signal, the memory controller including:
      a duty ratio adjusting circuit configured to generate a plurality of adjusted clock signals in response to a clock signal for strobing data, each of the plurality of adjusted clock signals having a different duty ratio;
      a selection signal generator configured to generate selection signals;
      a selection circuit configured to receive the clock signal and the plurality of adjusted clock signals and to output one signal among the clock signal and the plurality of adjusted clock signals as the output clock signal in response to the selection signals; and
      a programmable memory configured to store data for generating the selection signals; and
   a memory device configured to operate in response to the output clock signal from the memory controller,
   wherein the selection signal generator is configured to generate the selection signals based on the clock signal and a feedback clock signal that is output from the memory device.

10. The memory system of claim 9, wherein the memory device is one of a smart phone, a secure digital (SD) card, a micro SD card, a multimedia card (MMC), an embedded MMC (eMMC), an embedded Multi-Chip Package (eMCP), a Perfect Page NAND (PPN), and a universal flash storage (UFS).

11. The memory system of claim 9, wherein the programmable memory is a special function register (SFR).

12. The memory system of claim 9, wherein the selection signal generator is configured to align a first edge of the clock signal and a first edge of the feedback clock signal which is received from the memory device, and then generate the selection signals based on a difference between a second edge of the clock signal and a second edge of a feedback clock signal.

13. The memory system of claim 12, wherein, when the second edge of the feedback clock signal leads ahead the second edge of the clock signal, the selection signal generator is configured to generate the selection signals for outputting the output clock signal having on-time longer than on-time of the clock signal.

14. The memory system of claim 12, wherein, when the second edge of the feedback clock signal lags behind the second edge of the clock signal, the selection signal generator is configured to generate the selection signals for outputting the output clock signal having on-time shorter than on-time of the clock signal.

15. The memory system of claim 9, wherein the memory controller is an application processor.

16. A solid state drive comprising:
   a memory device; and
   a controller configured to
      control the memory device, wherein the controller is configured to
      generate a plurality of adjusted clock signals in response to a clock signal for strobing data,
      generate selection signals based on the clock signal and a feedback clock signal that is output from the memory device, and
      output one among the clock signal and the plurality of adjusted clock signals to the memory device as an output clock signal in response to the selection signals.

17. The solid state drive of claim 16, wherein the controller includes:
   a first adjusting circuit configured to differently decrease an on-time of the clock signal so as to generate a first group of clock signals included in the plurality of adjusted clock signals; and
   a second adjusting circuit configured to differently increase the on-time of the clock signal so as to generate a second group of clock signals included in the plurality of adjusted clock signals.

18. The solid state drive of claim 16, wherein the controller includes:
   a first inverter chain configured to receive the clock signal;
   a first AND gate configured to perform an AND operation on the clock signal and an output signal of the first inverter chain;
   a second inverter chain configured to receive the clock signal;
   a first OR gate configured to perform an OR operation on the clock signal and an output signal of the second inverter chain;
   a third inverter chain configured to receive the clock signal;
   a second AND gate configured to perform an AND operation on the clock signal and an output signal of the third inverter chain;
   a fourth inverter chain configured to receive the clock signal; and a second OR gate configured to perform an OR operation on the clock signal and an output signal of the fourth inverter chain.

19. The solid state drive of claim 18, wherein the controller is configured to output one of the clock signal, an output signal of the first AND gate, an output signal of the second AND gate, an output signal of the first OR gate and an output of the second OR gate as the output clock signal in response to the selection signals.

20. The solid state drive of claim 16, wherein the memory controller is further configured to generate selection signals based on the clock signal and a feedback clock signal that is output from the memory device by aligning a first edge of the clock signal and a first edge of the feedback clock signal which is received from the memory device, and then generating the selection signals based on a difference between a second edge of the clock signal and a second edge of the feedback clock signal.

* * * * *